(12) United States Patent
Van Zanten

(10) Patent No.: US 7,071,780 B2
(45) Date of Patent: Jul. 4, 2006

(54) DIFFERENTIAL AMPLIFIER WITH A COMMON MODE VOLTAGE LOOP

(75) Inventor: François Van Zanten, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 90 days.

(21) Appl. No.: 10/826,467

(22) Filed: Apr. 16, 2004

(65) Prior Publication Data
US 2004/0207470 A1   Oct. 21, 2004

(30) Foreign Application Priority Data
Apr. 17, 2003   (FR) .................................. 03 04829

(51) Int. Cl.
H03F 3/45   (2006.01)
(52) U.S. Cl. .......................................... 330/258; 330/9
(58) Field of Classification Search ................ 330/258, 330/259, 85, 9
See application file for complete search history.

(56) References Cited

U.S. PATENT DOCUMENTS 4,533,876 A   8/1985  Haque et al.
4,752,744 A *  6/1988  Aoki ............................ 330/252
6,965,268 B1 * 11/2005  Dyer et al. .................. 330/258
2002/0167357 A1  11/2002  Renous

OTHER PUBLICATIONS

Luciano Tomasini, et al., A Fully Differential CMOS Line Driver for ISDN, IEEE Journal of Solid-State Circuits, vol. 25, No. 2 (1990).
French Search Report, FR0304829, Dec. 12, 2003.

* cited by examiner

Primary Examiner—Henry Choe
(74) Attorney, Agent, or Firm—Lisa K. Jorgenson; Paul F. Rusyn; Graybeal Jackson Haley

(57) ABSTRACT

An amplifier circuit comprising an amplification chain having a differential output stage; a common mode correction block acting on the input of the output stage as a function of a common mode voltage at the output of said stage and introducing a phase shift between its input and its output for frequencies close to the cut-off frequency of the circuit; and, in parallel with the correction block, a means introducing no phase shift between its input and its output and having at frequencies greater than or equal to the circuit cut-off frequency an output impedance much smaller than the output impedance of the correction block.

26 Claims, 3 Drawing Sheets

US 7,071,780 B2

DIFFERENTIAL AMPLIFIER WITH A COMMON MODE VOLTAGE LOOP

PRIORITY CLAIM

This application claims priority from French patent application No. 03/04829, filed Apr. 17, 2003, which is incorporated herein by reference.

BACKGROUND

1. Technical Field

The present invention relates to the field of integrated circuits, and more specifically relates to amplifiers with a differential output.

2. Discussion of the Related Art

FIG. 1 schematically shows a feedback amplifier circuit 1 having a differential input and a differential output comprising a transconductance amplifier stage 2 having two output terminals "+" and "−" respectively connected to two inputs "+" and "−" of a transconductance inverter amplifier 4. The feedback loop of the amplifier comprises two impedances 6A, 6B respectively connecting output terminals "+" and "−" of stage 4 to input terminals "−" and "+" of stage 2. Two impedances 8B, 8A connect input terminals "+" and "−" of stage 2 to two input terminals (IN+, IN−) of circuit 1. Impedances 8 (8A, 8B) form a voltage divider with impedances 6 (6A, 6B) of the feedback loop. Output terminals "+" and "−" of stage 4 form output terminals (OUT+, OUT−) of circuit 1. Two capacitors 10B, 10A respectively connect input terminals "+" and "−" of stage 4 to its output terminals "−" and "+".

A voltage divider 12 comprising two identical resistors is connected between the output terminals of stage 4. The midpoint of dividing bridge 12 is connected to a first input terminal of a common mode correction transconductance amplifier block 14 with a differential input and output. A second input terminal of block 14 receives a reference voltage Vref provided by a voltage source not shown. Each of the output terminals of block 14 is connected to an input terminal of stage 4. Block 14 and voltage divider 12 form a non-inverting common mode correction loop.

As the frequency increases, the various amplifier elements of circuit 1 (stages 2 and 4 and block 14) each introduce a phase-shift likely to make unstable, according to cases, the amplification chain of the circuit comprising stages 2 and 4 or the common mode correction chain comprising stage 4 and block 14. Capacitors 10 (10A, 10B), currently called Miller capacitors, ensure the stability of both the amplification chain and the common mode correction chain. The value of the Miller capacitors must be carefully chosen, given that, although Miller capacitors of high value guarantee a good circuit stability, they reduce the gain-bandwidth product of the circuit.

In the case where the differential closed-loop gain of amplifier 1 must be high, the feedback loop, formed of resistors 6A, 8A, and 6B, 8B, is strongly attenuating, which accordingly reduces the open-loop gain of the amplification chain. This attenuation however does not apply to the open-loop gain of the common-mode correction chain. The stability of the common-mode correction chain then cannot be ensured, unless either the gain-bandwidth product of the amplifier is reduced by increasing the value of capacitors 10A and 10B, or the open-loop gain of the common mode correction chain and its correction dynamics are reduced. Such a reduction especially results in reducing the accuracy and enhancing the sensitivity of the common mode correction chain to external disturbances, such as temperature and manufacturing dispersions.

SUMMARY

An aspect of the present invention is to provide a differential common mode correction amplifier circuit exhibiting a high gain-bandwidth product.

Another aspect of the present invention is to provide such an amplifier circuit, the common mode correction of which is little sensitive to external factors.

To achieve these and other aspects, the present invention provides an amplifier circuit comprising:

an amplification chain comprising a differential output stage; and
  a common mode correction block acting on the input of the output stage according to a common mode voltage at the output of said stage and introducing a phase shift between its input and its output for frequencies close to the cut-off frequency of the circuit; and
  comprising in parallel with the correction block a means introducing no phase shift between its input and its output and having at frequencies close to the circuit cut-off frequency an output impedance much smaller than the output impedance of the correction block.

According to an embodiment of the present invention, the output stage has a differential input and said means comprises a unity-gain stage receiving as an input the common mode voltage and having its output connected by two first identical capacitors to each of the inputs of the output stage.

According to an embodiment of the present invention, the stability of the amplification chain is ensured by two identical second capacitors, each arranged between one input and one output of the output stage; and the first capacitors have a value such that they conduct, for frequencies close to the circuit cut-off frequency, a differential current smaller by one order of magnitude than the differential current crossing the second capacitors.

According to an embodiment of the present invention, the amplification chain further comprises an input stage with a differential input and output coupled to the input of the output stage and a feedback loop with a voltage divider coupling the output of the output stage to the input of the input stage.

According to an embodiment of the present invention, the unity-gain stage comprises a first MOS transistor of a first conductivity type connected as a source follower.

According to an embodiment of the present invention, the correction block comprises: two second MOS transistors of a first conductivity type having their sources connected to a ground via first resistors, the gate of one of the second transistors being connected between two second equal resistors series-connected between the output terminals of the output stage and the gate of the other one of the second transistors being connected to a reference voltage;

two third MOS transistors of a second conductivity type having their drains connected to the drains of the two second transistors, the sources of the third transistors being connected to a supply voltage and their gates being connected to the drain of that of the second transistors having its gate connected to the reference voltage;
  two fourth transistors of the second conductivity type having their sources connected to the supply voltage, having their gates connected to the drain of that of the second transistors having its gate connected between the second resistors, and having their drains forming the output terminals of the amplifier stage;

the first transistor being confounded with that of the second transistors having its gate connected between the second resistors.

According to an embodiment of the present invention, the correction block comprises: two second MOS transistors of a first conductivity type having their sources connected to a ground via first current sources, and connected together by a first resistor, the gate of one of the second transistors being connected between two second equal resistors series-connected between the output terminals of the output stage and the gate of the other one of the second transistors being connected to a reference voltage;

two third MOS transistors of a second Conductivity type having their drains connected to the drains of the two second transistors, the sources of the third transistors being connected to a supply voltage and their gates being connected to the drain of that of the second transistors having its gate connected to the reference voltage;

two fourth transistors of the second Conductivity type having their sources connected to the supply voltage, having their gates connected to the drain of that of the second transistors having its gate connected between the second resistors, and having their drains forming the output terminals of the amplifier stage;

the first transistor being confounded with that of the second transistors having its gate connected between the second resistors.

According to an embodiment of the present invention, the output stage is formed of fifth and sixth MOS transistors of the second conductivity type having their sources connected to the supply voltage, having their drains, forming the output terminals of the output stage, connected to second current sources, and having their gates forming the input terminals of the output stage, two Miller capacitors respectively connecting the gates of the fifth and sixth transistors to the drains of said transistors.

According to an embodiment of the present invention, the input stage comprises seventh and eighth MOS transistors of the first conductivity type having their sources coupled to a third current source, the drains of the seventh and eighth transistors forming the output terminals of the input stage and being respectively connected to the gates of the sixth and fifth transistors, the gates of the seventh and eighth transistors forming the input terminals of the input stage and being respectively connected by first impedances to the drains of the fifth and sixth transistors, and by second impedances to two input terminals of the circuit.

According to an embodiment of the present invention, the supply voltage is a positive voltage and the transistors of the first and second conductivity types are respectively N-channel and P-channel transistors.

The foregoing aspects, features, and advantages of the present invention will be discussed in detail in the following non-limiting description of specific embodiments in connection with the accompanying drawings.

DETAILED DESCRIPTION

Figure 1:
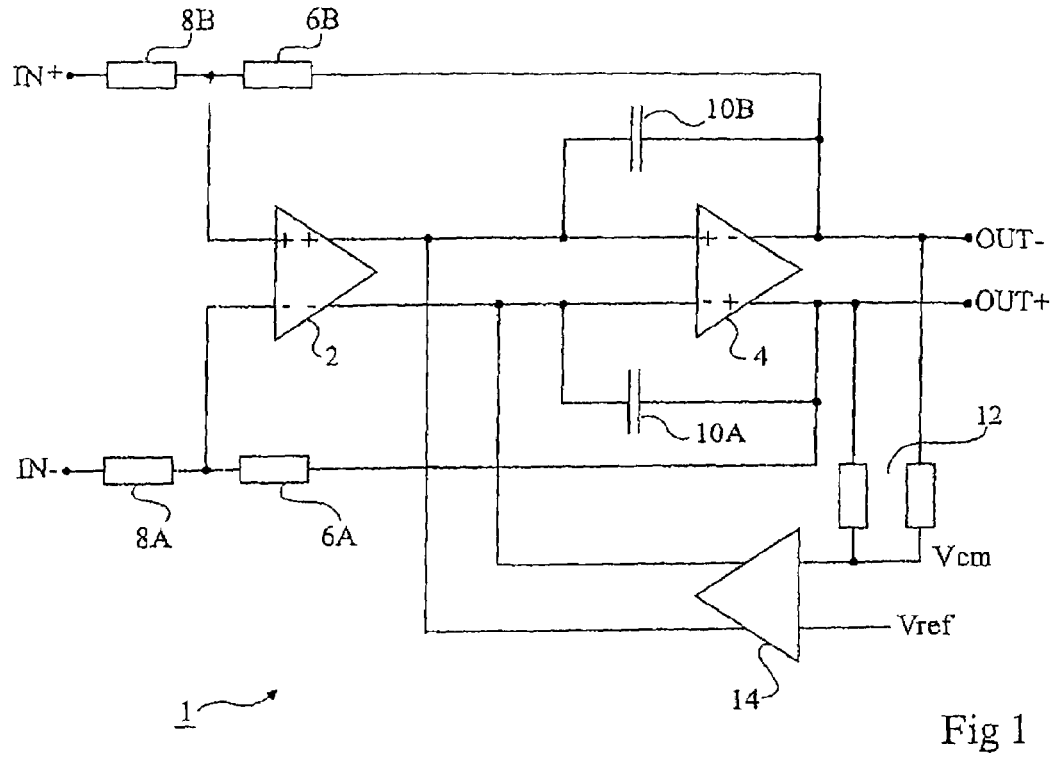
FIG. 1, previously described, schematically shows a conventional amplifier circuit.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Same elements have been designated with same reference numerals in the different drawings. Only those elements that are necessary to the understanding of the present invention have been shown.

A contribution of the present inventor has been to note that, although the common mode correction block introduces a phase shift likely to cause a circuit instability, this phase shift is only significant, for stability, for frequencies close to the circuit cut-off frequency. Embodiments of the present invention thus consist of inhibiting the action of the correction block at frequencies close to the circuit cut-off frequency. For this purpose, embodiments of the present invention provide arranging parallel to the correction block a means introducing no phase shift and exhibiting at frequencies close to the circuit cut-off frequency (in practice, the amplification chain cut-off frequency) an output impedance much smaller than the output impedance of said block.

Figure 2:
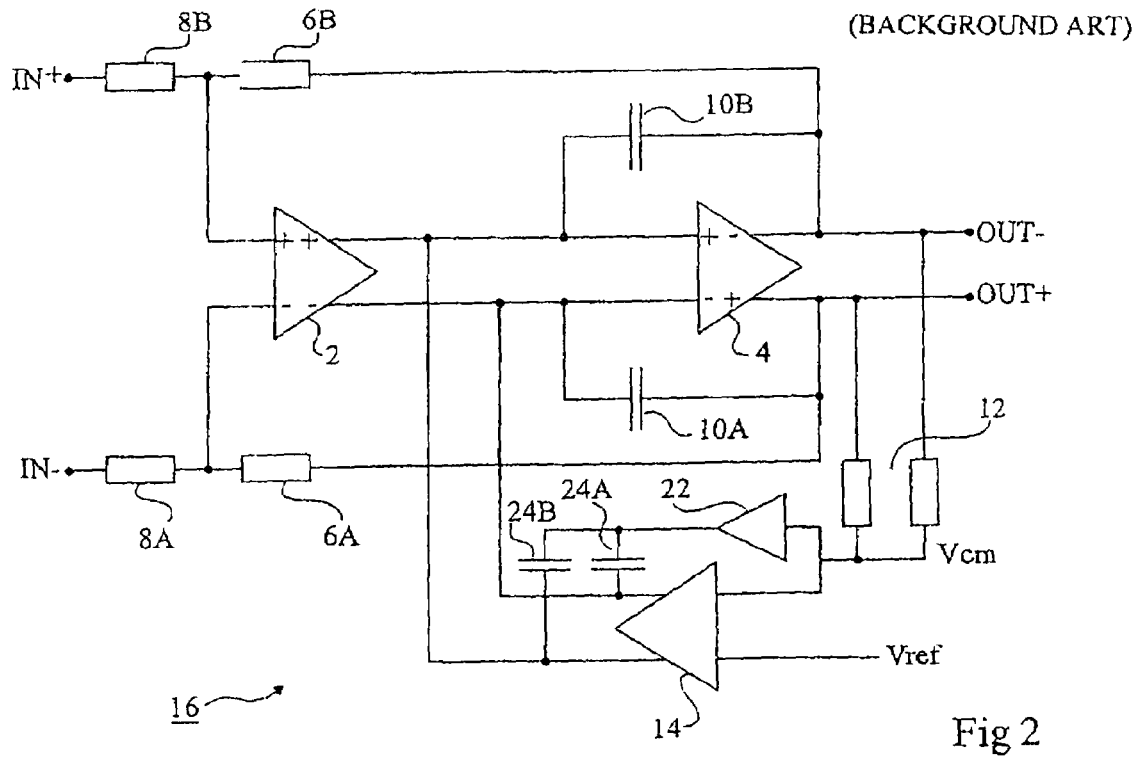
FIG. 2 schematically shows an amplifier circuit according to an embodiment of the present invention.

FIG. 2 schematically shows an amplifier circuit 16 according to an embodiment of the present invention. Circuit 16 comprises like the amplifier circuit of FIG. 1 a stage 2 connected to the input of an inverting stage 4, output terminals OUT+, OUT− of stage 4 being connected to the input terminals of stage 2 by impedances 6 (6A, 6B), 8 (8A, 8B) forming a voltage-dividing network. Two Miller capacitors 10 (10A, 10B) connect the input terminals of stage 4 to its output terminals. Between terminals OUT+ and OUT− is arranged a voltage divider 12 having its midpoint at common mode output voltage Vcm of stage 4. A common mode correction amplifier block 14 receives on a first input terminal voltage Vcm and on a second input terminal a reference voltage Vref The output terminals of block 14 are connected to the input terminals of stage 4.

This embodiment of the present invention provides connecting to the midpoint of divider 12 the input of a stage with a unity gain 22 introducing but a negligible phase shift between its input and its output, and arranging two identical capacitors 24 (24A, 24B), each between the output of stage 22 and an output terminal of block 14.

Stage 22 and capacitors 24 are selected so that the sum of the impedance of a capacitor 24 at frequencies close to the cut-off frequency of circuit 16 and of the output impedance of stage 22 is much smaller than the output of block 14. The phase-shifted signals provided at frequencies close to the circuit cut-off frequency by block 14 are thus negligible as compared to the corresponding signal not shifted in phase provided by stage 22 according to the embodiment of the present invention, and they are not likely to cause the circuit instability.

Conversely, at work frequencies of circuit 16, the impedance of capacitors 24 is much greater than the output impedance of block 14. Thus, at work frequencies of circuit 16, stage 22 does not intervene in the operation of circuit 16 while block 14 is used normally in the common-mode correction chain. The cut-off frequency is generally selected one decade under the maximum work frequency so that the amplifier does not notably alter the spectrum of the signal to be processed. For example, for so-called "zero IF" GSM baseband receive filters, the signal frequency is smaller than 1 MHz, and the cut-off frequency of the amplifiers forming the filter ranges between 8 and 10 MHz. Similarly, for WCDMA baseband receive filters, the signal frequency is smaller than 10 MHz, and the cut-off frequency of the amplifiers forming the filter ranges between 50 and 100 MHz. The preceding values depend on the application and on the accuracy requirements for the signal to be processed as well as on the noise signals to be rejected.

It has been previously seen that stage 22 introduces no significant phase-shift at frequencies close to the circuit cut-off frequency. In practice, the cutoff frequency of stage 22 is such that stage 22 still introduces a phase shift, but only at high frequencies for which the circuit gain is smaller than 1. The phase shift introduced by stage 22 in these conditions does not adversely affect the stability of the common-mode correction chain.

The value of capacitors 24 is also selected to be sufficiently small not to charge, in the vicinity of the cutoff frequency, the differential output of stage 4, which would result in altering the amplification chain stability. In other words, for frequencies close to the cutoff frequency, the differential current flowing through capacitors 24 must be of an order of magnitude smaller than the differential current flowing through the Miller capacitors. In practice, the value of capacitors 24, which is preferably chosen by electric simulation, may be on the order of one fifth of that of the Miller capacitors.

Correction block 14 is according to an embodiment of the present invention bypassed for high frequencies, thus suppressing the phase-shift introduced by block 14, and whatever the values of the Miller capacitors. Embodiments of the present invention thus enable the common-mode correction chain to remain stable with a value of the Miller capacitors chosen to only ensure the stability of the single amplification chain, whatever the attenuation of the feedback loop (voltage dividers 6A, 8A, and 6B, 8B). Said attenuation sets the closed-loop gain to the desired value. Since this attenuation does not apply, in practice, to the common-mode correction chain, the latter would be unstable without these embodiments of the present invention, short of strongly increasing the value of the Miller capacitors, which would at the same time reduce the gain-bandwidth product of the amplifier.

The embodiments of the present invention also enable using a common-mode correction block 14 having a high gain without risking to make the circuit unstable, which enables obtaining a high accuracy of the common-mode correction, and making the correction little sensitive to disturbances such as temperature or technological dispersions.

It should be noted that the embodiments of the present invention advantageously apply to an amplifier circuit (not shown) having a gain switchable between a low gain and a high gain. The embodiments of the present invention indeed enable ensuring the common-mode correction chain stability without having to reduce the gain-bandwidth product for the low gain for the sole purpose of ensuring the stability for the high gain, as was the case in the state of the art.

Figure 3:
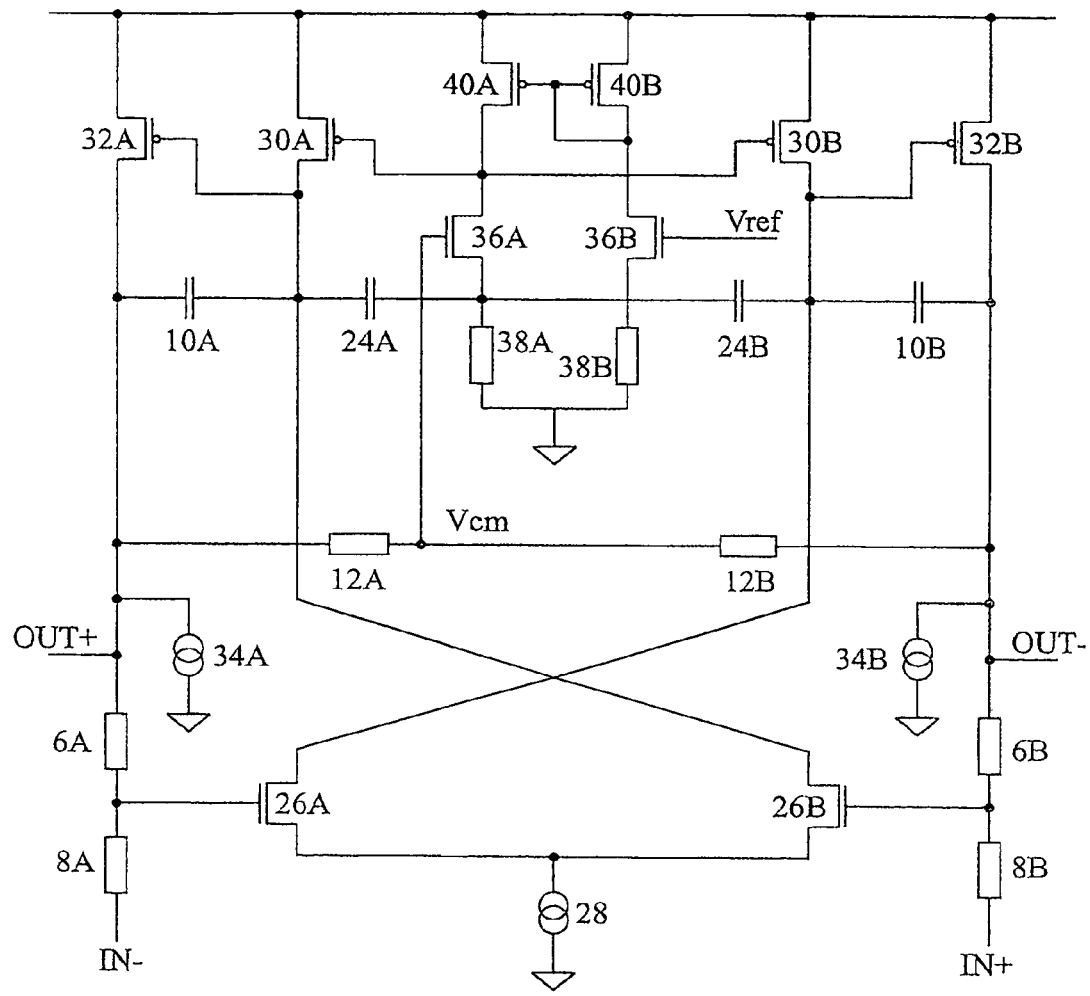
FIG. 3 shows in detail an amplifier circuit according to an embodiment of the present invention.

FIG. 3 shows an embodiment of an amplifier circuit 16 according to an embodiment of the present invention in which stage 2 is formed of two N-channel MOS transistors 26A, 26B, having their sources coupled to a constant current source 28. The drains of transistors 26A, 26B form the output terminals of stage 2 and are respectively connected to the drains of P-channel MOS charge transistors 30B, 30A operating as current sources. The sources of transistors 30A, 30B are connected to a supply voltage. Stage 4 is formed of P-channel MOS transistors 32A, 32B having their sources connected to the supply voltage. The drains of transistors 32A, 32B form the output terminals of stage 4 and of circuit 16 (OUT+, OUT−) and are connected to constant charge current sources 34A, 34B. The gates of transistors 32A, 32B form the input terminals of stage 4 and are respectively connected to the drains of transistors 26B, 26A. Impedances 6A, 6B connect the drains of transistors 32A, 32B to the gates of transistors 26A, 26B. Impedances 8A, 8B respectively connect the gates of transistors 26A, 26B to two input terminals IN−, IN+ of the circuit. Miller capacitors 10A, 10B respectively connect the gates of transistors 32A, 32B to their drains. Identical resistors 12A, 12B are series-connected between the drains of transistors 32A, 32B.

Block 14 comprises two N-channel MOS transistors 36A, 36B having their sources grounded via resistors 38A, 38B and having their drains connected to the drains of two P-channel MOS transistors 40A, 40B. The sources of transistors 40A, 40B are connected to the supply voltage and their gates are connected to the drain of transistor 36B. The gate of transistor 36B is connected to a common-mode reference voltage Vref. The gate of transistor 36A is connected between resistors 12A and 12B. The drain of transistor 40A is connected to the gates of transistors 30A, 30B, which act as controllable current sources. Capacitors 24A, 24B according to this embodiment of the present invention connect the source of transistor 36A respectively to the drains of transistors 30A, 30B.

Unity-gain stage 22 is formed of the source follower connection comprised of transistor 36A and of resistor 38A. The input and the output of stage 22 are respectively the gate and the source of transistor 36A. Such a source follower connection has in known fashion a particularly high cut-off frequency. Stage 22 provides current to capacitors 24A, 24B, without any current to be consumed at the level of the circuit output through resistors 12, 12B.

Block 14 directly controls the gates of charge transistors 30A, 30B, which adjust their currents to compensate for the current of source 28. A very small difference between the gate voltages of transistors 36A, 36B results in a strong current variation in transistors 30A, 30B. This structure gives the common-mode correction loop high dynamics and a high open loop gain, which enables accurate correction of the common mode voltage. The value of capacitors 24A, 24B is selected so that at frequencies close to the cut-off frequency of circuit 16, the sum of the source impedance of circuit 36A and of capacitor 24A or 24B is much smaller, respectively, than the impedance of the drains of transistors 30A or 30B.

Embodiments of the present invention have been described in relation with a unity-gain stage 22 using a transistor 36A of the common-mode correction block, but it will easily adapt to such an amplifier using a transistor that does not belong to the correction block.

Of course, embodiments of the present invention are likely to have various alterations, modifications, and improvements which will readily occur to those skilled in the art. In particular, the embodiments of the present invention have been described in relation with a specific circuit structure, but it will easily adapt to any equivalent circuit structure, and especially to any equivalent structure of the correction block.

Figure 4:
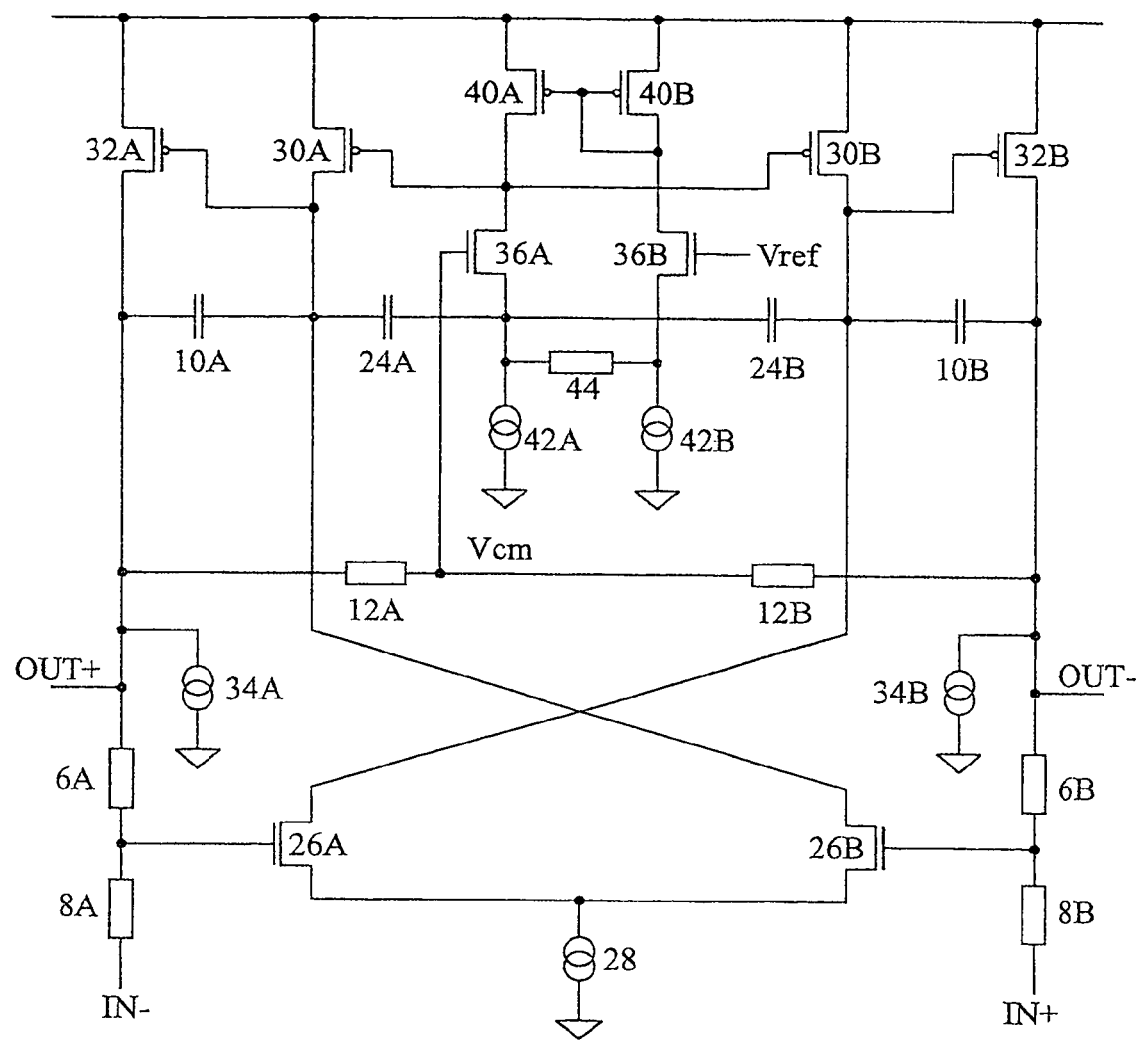
FIG. 4 shows in detail another amplifier circuit according to an embodiment of the present invention.

FIG. 4 shows as an example of another amplifier circuit according to an embodiment of the present invention. The amplifier circuit has the same structure as the circuit shown in FIG. 3, except that the sources of transistors 36A, 36B of the correction block are not grounded by resistors, but are respectively grounded by current sources 42A, 42B, and are interconnected by a resistor 44, to provide a current independent from the supply voltage.

The embodiments of the present invention have been described in relation with a specific output stage, but the output stage may also be a class-AB stage. Further, embodiments of the present invention have been described in relation with an amplifier circuit with a differential input and output, but it will easily adapt to any common-mode correction amplifier circuit, for example, an amplifier circuit with a non-differential input and a differential output.

The embodiments of the present invention have been described in relation with an amplifier circuit comprising a specific number of stages in its amplification and correction chains, but it will easily adapt to an amplifier circuit comprising a different number of stages.

The embodiments of the present invention have been described in relation with MOS transistors, but it will easily adapt to bipolar transistors or to a combination of MOS and bipolar transistors.

The amplifiers according to the described embodiments of the present invention may be used in any electronic circuit in which it is necessary to process differential signals, such as audio circuits, mobile phone baseband circuits, circuits of analog video processing before analog-to-digital coding, in filters using operational amplifiers of Leap-Frog or Rauch type, switchable-gain amplifiers, etc.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An amplifier circuit comprising:
   an amplification chain having at least an input stage and a differential output stage;
   a common mode correction block acting on the input of the output stage as a function of a common mode voltage at the output of said stage and introducing a phase shift between its input and its output for frequencies close to the cut-off frequency of the circuit; and
   in parallel with the correction block, a means introducing no phase shift between its input and its output and having at frequencies close to the circuit cut-off frequency an output impedance much smaller than the output impedance of the correction block.

2. The amplifier circuit of claim 1, wherein the output stage has a differential input and said means comprises a unity-gain stage receiving as an input the common mode voltage and having its output connected by two first identical capacitors to each of the inputs of the output stage.

3. The amplifier circuit of claim 2, wherein the stability of the amplification chain is ensured by two identical second capacitors, each arranged between one input and one output of the output stage; and wherein the first capacitors have a value such that they conduct, for frequencies close to the circuit cut-off frequency, a differential current smaller by one order of magnitude than the differential current crossing the second capacitors.

4. The amplifier circuit of claim 3, wherein the amplification chain further comprises an input stage with a differential input and output coupled to the input of the output stage and a feedback loop with a voltage divider coupling the output of the output stage to the input of the input stage.

5. The amplifier circuit of claim 2, wherein the unity-gain stage comprises a first MOS transistor of a first conductivity type connected as a source follower.

6. The amplifier circuit of claim 5, wherein the correction block comprises:
   two second MOS transistors of a first conductivity type having sources connected to a ground via first resistors, the gate of one of the second transistors being connected between two second equal resistors series-connected between the output terminals of the output stage and the gate of the other one of the second transistors being connected to a reference voltage;
   two third MOS transistors of a second conductivity type having drains connected to drains of the two second transistors, sources connected to a supply voltage and gates connected to the drain of that of the second transistors having its gate connected to the reference voltage;
   two fourth transistors of the second conductivity type having sources connected to the supply voltage, gates connected to the drain of that of the second transistors having its gate connected between the second resistors, and drains forming the output terminals of the amplifier stage;
   and wherein the first transistor is confounded with that of the second transistors having its gate connected between the second resistors.

7. The amplifier circuit of claim 5, wherein the correction block comprises:
   two second MOS transistors of a first conductivity type having sources connected to a ground via first current sources, and connected together by a first resistor, the gate of one of the second transistors being connected between two second equal resistors series-connected between the output terminals of the output stage and the gate of the other one of the second transistors being connected to a reference voltage;
   two third MOS transistors of a second conductivity type having drains connected to the drains of the two second transistors, sources connected to a supply voltage, and gates connected to the drain of that of the second transistors having its gate connected to the reference voltage;
   two fourth transistors of the second conductivity type having sources connected to the supply voltage, gates connected to the drain of that of the second transistors having its gate connected between the second resistors, and drains forming the output terminals of the amplifier stage;
   and wherein the first transistor is confounded with that of the second transistors having its gate connected between the second resistors.

8. The amplifier circuit of claim 6, wherein the output stage is formed of fifth and sixth MOS transistors of the second conductivity type having sources connected to the supply voltage, drains, forming the output terminals of the output stage, connected to second current sources, and gates forming the input terminals of the output stage, two Miller capacitors respectively connecting the gates of the fifth and sixth transistors to the drains of said transistors.

9. The amplifier circuit of claim 8, wherein the input stage comprises seventh and eighth (26B) MOS transistors of the first conductivity type having sources coupled to a third current source, drains forming the output terminals of the input stage and being respectively connected to the gates of the sixth and fifth transistors, and gates forming the input terminals of the input stage and being respectively connected by first impedances to the drains of the fifth and sixth transistors, and by second impedances to two input terminals of the circuit.

10. The amplifier circuit of claim 6, wherein the supply voltage is a positive voltage and the transistors of the first and second conductivity types are respectively N-channel and P-channel transistors.

11. A common mode correction circuit operable in a normal mode to develop a common mode feedback value on an output in response to an input signal applied on an input, and operable in a cut-off mode when the input signal is near a cut-off frequency to inhibit the development of the common mode feedback value on the output.

12. The common mode correction circuit of claim 11 wherein the correction circuit includes a cut-off circuit coupled between the input and output of the correction circuit, and wherein the cut-off circuit is operable to provide a cut-off output impedance in parallel with an output impedance of the correction circuit when the input signal is near the cut-off frequency, the cut-off output impedance being much smaller than the output impedance of the correction circuit near the cut-off frequency.

13. The common mode correction circuit of claim 12 wherein the correction circuit includes differential inputs and differential outputs, and wherein the cut-off circuit is operable to provide respective cut-off output impedances in parallel with each of the differential outputs.

14. The common mode correction circuit of claim 12 wherein the cut-off circuit introduces an approximately unity gain and a substantially zero phase shift between signals developed on outputs coupled to the outputs of the correction circuit and signal applied on inputs coupled to the inputs of the correction circuit near the cut-off frequency.

15. An amplifier circuit, comprising:
a first differential amplifier having at least one input and differential outputs;
a common mode correction circuit having inputs coupled to the outputs of the first differential amplifier and having an output coupled to the input of the first differential amplifier, the common mode correction circuit operable in a normal mode to develop a common mode feedback value on its output in response to signals applied on its inputs, and operable in a cut-off mode when the input signals are near a cut-off frequency to inhibit the development of the common mode feedback value on the output.

16. The amplifier circuit of claim 15 wherein the first differential amplifier includes differential inputs and further includes Miller capacitors coupled between each input and output, and wherein the cut-off capacitors have values that are sufficiently less than values of the Miller capacitors such that a differential current flowing through the cut-off capacitors is approximately an order of magnitude less than a differential current flowing through the Miller capacitors.

17. The amplifier circuit of claim 16 wherein the correction circuit includes a cut-off circuit coupled between the inputs and outputs of the correction circuit, and wherein the cut-off circuit is operable to provide cut-off output impedances in parallel with output impedances of the correction circuit when the signals at the output of the first differential amplifier are near the cut-off frequency, the cut-off output impedances being much smaller than the output impedances of the correction circuit near the cut-off frequency.

18. The amplifier circuit of claim 17 wherein the cut-off impedances have values that are approximately one fifth the values of the Miller capacitances.

19. The amplifier circuit of claim 18 further comprising a second differential amplifier having inputs adapted to receive input signals and having outputs coupled to the inputs of the first differential amplifier.

20. The amplifier circuit of claim 19 wherein the cut-off circuit introduces an approximately unity gain and a substantially zero phase shift between signals developed on outputs coupled to the outputs of the correction circuit and signal applied on inputs coupled to the inputs of the correction circuit near the cut-off frequency.

21. An electronic system, comprising:
electronic circuitry including an amplifier circuit, including,
a first differential amplifier having at least one input and differential outputs;
a common mode correction circuit having inputs coupled to the outputs of the first differential amplifier and having an output coupled to the input of the first differential amplifier, the common mode correction circuit operable in a normal mode to develop a common mode feedback value on its output in response to signals applied on its inputs, and operable in a cut-off mode when the input signals are near a cut-off frequency to inhibit the development of the common mode feedback value on the output.

22. The electronic system of claim 21 wherein the electronic circuitry comprises a variable gain amplifier circuit.

23. The electronic system of claim 22 wherein the variable gain amplifier circuit comprises an operational amplifier circuit.

24. A method of controlling a common mode feedback value in an amplifier having at least one input and differential outputs, the method comprising:
developing a feedback value responsive to signals on the outputs of the amplifier when the frequency of an input signal applied to the differential amplifier is not near a cut-off frequency;
applying the feedback value to the input of the differential amplifier; and
disabling application of the feedback value to the input of the amplifier when the frequency of the input signal is near the cut-off frequency.

25. The method of claim 24 wherein disabling application of the feedback value to the input of the amplifier when the frequency of the input signal is near the cut-off frequency comprises coupling an impedance in parallel with the input of the differential amplifier, the impedance having a sufficiently small value to reduce the value of the feedback value applied to the input of the amplifier and thereby effectively disable application of the feedback value to the input of the amplifier.

26. The method of claim 25 wherein the impedance has a value that is a function of the values of Miller capacitances coupled between the input and outputs of the differential amplifier.

* * * * *